United States Patent
Moore et al.

(10) Patent No.: US 12,494,774 B2
(45) Date of Patent: Dec. 9, 2025

(54) ADAPTIVE RAMP TIME MODULATION

(71) Applicant: POWER INTEGRATIONS, INC., San Jose, CA (US)

(72) Inventors: Karl Moore, Ely (GB); Antonius Werner, Cambridge (GB)

(73) Assignee: Power Integrations, Inc., San Jose, CA (US)

( * ) Notice: Subject to any disclaimer, the term of this patent is extended or adjusted under 35 U.S.C. 154(b) by 14 days.

(21) Appl. No.: 18/556,007

(22) PCT Filed: Jul. 2, 2021

(86) PCT No.: PCT/US2021/040297
§ 371 (c)(1),
(2) Date: Oct. 18, 2023

(87) PCT Pub. No.: WO2023/277922
PCT Pub. Date: Jan. 5, 2023

(65) Prior Publication Data
US 2024/0213967 A1 Jun. 27, 2024

(51) Int. Cl.
*H03K 5/08* (2006.01)
*H02M 1/088* (2006.01)
*H03K 3/0234* (2006.01)

(52) U.S. Cl.
CPC ............ *H03K 5/082* (2013.01); *H02M 1/088* (2013.01); *H03K 3/0234* (2013.01)

(58) Field of Classification Search
CPC ...... H03K 5/082; H03K 3/0234; H02M 1/088
See application file for complete search history.

(56) References Cited

U.S. PATENT DOCUMENTS

| | | |
|---|---|---|
| 5,245,526 A | 9/1993 | Balakrishnan et al. |
| 6,781,357 B2 | 8/2004 | Balakrishnan et al. |
| | (Continued) | |

FOREIGN PATENT DOCUMENTS

| | | |
|---|---|---|
| CN | 109309451 A | 2/2019 |
| EP | 3211780 A1 | 1/2017 |
| | (Continued) | |

OTHER PUBLICATIONS

InnoSwitch4-CZ Family, "Off-Line CV/CC ZVS Flyback Integrated Switcher IC with 750 V PowiGaN, Active Clamp Drive and Synchronous Rectification," Power Integrations, Jun. 2023, pp. 1-37, www.power.com.

(Continued)

*Primary Examiner* — Daniel C Puentes
(74) *Attorney, Agent, or Firm* — Christensen O'Connor Johnson Kindness PLLC

(57) ABSTRACT

A controller for a power converter comprising a drive circuit and an adaptive current limit generator. The drive circuit is coupled to receive a request signal representative of a power demand of an output of the power converter. The drive circuit is configured to generate a drive signal to control switching of a power switch in response to the request signal. The adaptive current limit generator configured to generate a current limit signal and the drive circuit is configured to turn off the power switch when a current sense signal reaches the current limit signal. The adaptive current limit generator is configured to vary an upper threshold of the current limit signal to a first value when a switching frequency is less than a frequency threshold and vary the upper threshold to a second value when the switching frequency is greater than the frequency threshold.

29 Claims, 7 Drawing Sheets

(56) References Cited

U.S. PATENT DOCUMENTS

| | | | |
|---|---|---|---|
| 7,215,107 B2 | 5/2007 | Djenguerian et al. | |
| 7,233,504 B2 | 6/2007 | Djenguerian et al. | |
| 7,397,231 B2 | 7/2008 | Wang | |
| 7,613,019 B2 | 11/2009 | Kroes | |
| 7,746,050 B2 | 6/2010 | Djenguerian et al. | |
| 7,898,826 B2 | 3/2011 | Matthews | |
| 7,936,159 B2 | 5/2011 | Park et al. | |
| 7,990,127 B2 | 8/2011 | Saint-Pierre | |
| 8,213,187 B2 | 7/2012 | Matthews | |
| 8,611,116 B2 | 12/2013 | Baurle et al. | |
| 8,994,351 B2 * | 3/2015 | Zhang | H02M 3/33523 323/284 |
| 9,209,762 B1 | 12/2015 | Mortazavi et al. | |
| 9,246,392 B2 | 1/2016 | Balakrishnan et al. | |
| 9,332,613 B2 | 5/2016 | Pregitzer et al. | |
| 9,391,523 B2 | 7/2016 | Gaknoki et al. | |
| 9,450,478 B1 | 9/2016 | Djenguerian et al. | |
| 9,680,383 B2 | 6/2017 | Mao et al. | |
| 9,774,248 B2 | 9/2017 | Saint-Pierre et al. | |
| 9,954,461 B1 | 4/2018 | Duvnjak | |
| 10,088,854 B2 | 10/2018 | Pham et al. | |
| 10,205,394 B2 * | 2/2019 | Pham | H03K 17/687 |
| 10,277,136 B2 | 4/2019 | Werner et al. | |
| 2013/0301311 A1 | 11/2013 | Wang et al. | |

FOREIGN PATENT DOCUMENTS

| | | |
|---|---|---|
| EP | 3297147 A2 | 9/2017 |
| EP | 3641120 A1 | 10/2019 |

OTHER PUBLICATIONS

International Search Report and Written Opinion mailed Mar. 10, 2022, issued in corresponding international Application No. PCT/US2021/040297, filed Jul. 2, 2021, 16 pages.

International Preliminary Report on Patentability mailed Jan. 11, 2024, issued in corresponding international Application No. PCT/US2021/040297, filed Jul. 2, 2021, 10 pages.

Chen et al., "A High-Efficiency Positive Buck-Boost Converter With Mode-Select Circuit and Feed-Forward Techniques," in IEEE Transactions on Power Electronics, vol. 28, No. 9, pp. 4240-4247, Sep. 2013, doi: 10.1109/TPEL.2012.2223718.

* cited by examiner

ADAPTIVE RAMP TIME MODULATION

CROSS-REFERENCES TO RELATED APPLICATIONS

This application is a National Stage of International Application No. PCT/US2021/040297 filed Jul. 2, 2021, the disclosures of which are incorporated herein in their entirety.

BACKGROUND OF THE INVENTION

Field of the Invention

The present disclosure relates generally to power converters, and more particularly, to controllers for power converters.

Discussion of the Related Art

Electronic devices use power to operate. Switched mode power converters are commonly used due to their high efficiency, small size, and low weight to power many of today's electronics. Conventional wall sockets provide a high voltage alternating current. In a switching power converter, a high voltage alternating current (ac) input is converted to provide a well-regulated direct current (dc) output through an energy transfer element. The switched mode power converter controller usually provides output regulation by sensing one or more signals representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter. These various modes of control may be referred to as pulse width modulation (PWM) control, pulse frequency modulation (PFM) control or ON/OFF control.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
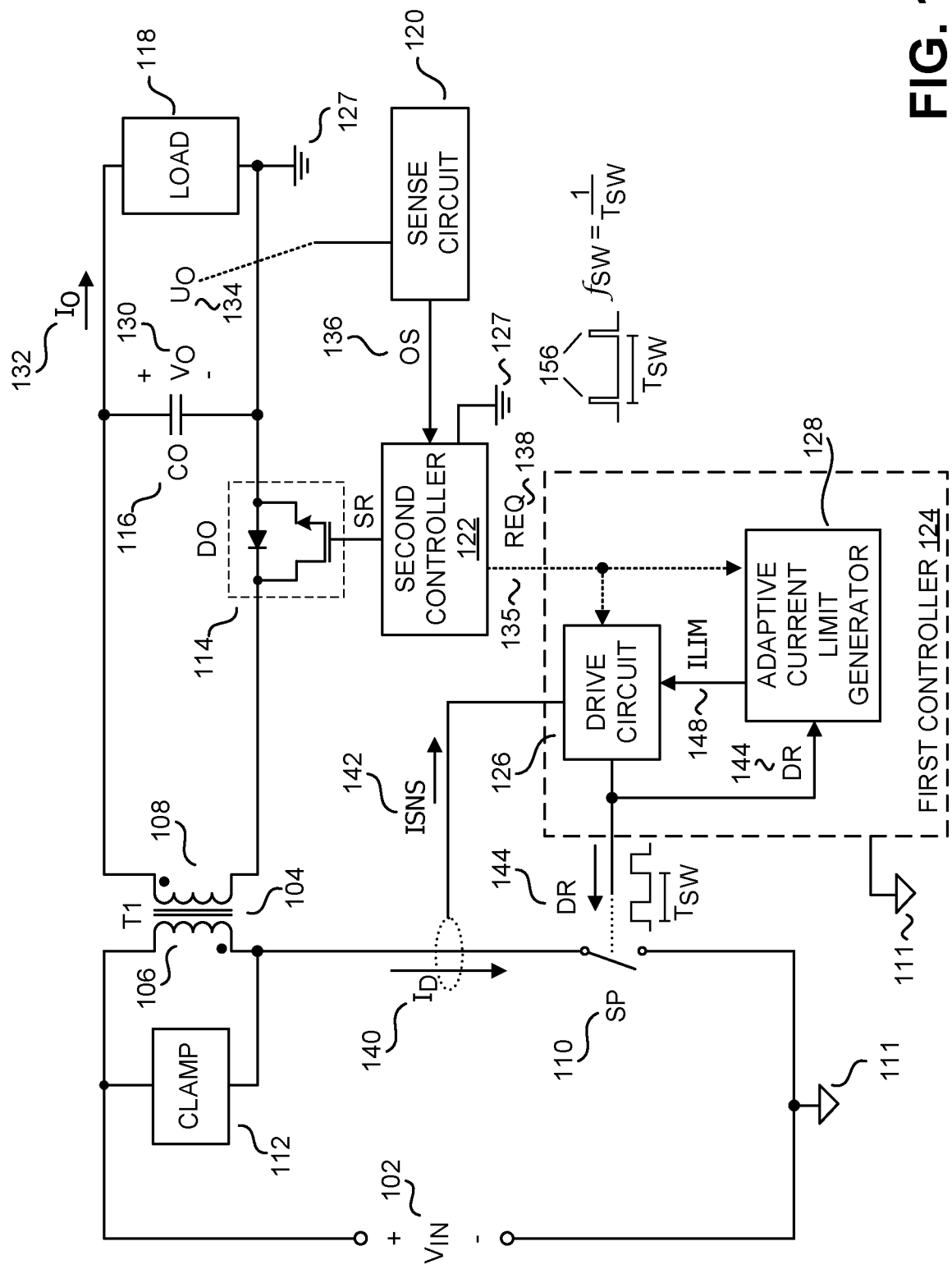
FIG. 1 illustrates an example of a switched mode power converter in a flyback configuration with a synchronous rectifier, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure, or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Various modes of control may be utilized to regulate the output of a power converter. One mode of control may be referred to as ramp time modulation (RTM) control. For RTM control, a request signal to turn ON or OFF the power switch is received by the controller. The request signal includes a series of events which turn ON the power switch. These request events may be received on-demand, or in other words, asynchronously whenever the output requires additional energy to be delivered. For example, in one response to an event in the request signal, the controller turns ON the power switch. The power switch is turned OFF when the switch current of the power switch reaches a current limit. The current limit varies in response to the duration between consecutive events in the request signal. For example, the current limit may be a ramp signal which increases in response to turning OFF the power switch and then decreases. The current limit can increase and decrease within a current limit range, between a lower threshold LOWER and an upper threshold UPPER. This increasing and decreasing ramping current limit, along with the request signal, may be used to modulate the drive signal which controls the turn ON and turn OFF of the power switch to regulate the output of the power converter.

For RTM control, the normalized peak switching current is relatively low at slower switching frequencies but begins to increase quickly as the switching frequency increases. Past this increase, the normalized peak switching current increases less in response to increased switching frequency. In other words, the slope of the normalized peak switching current is small over a wide range of switching frequencies. The output power delivered by the power converter is generally a function of the peak switch current and the switching frequency. In this relatively small slope region, the output power is mostly determined by the switching frequency. For example, increasing the switching frequency increases the output power.

Typical losses related to the power switch are conduction losses and switching losses, also referred to as crossover losses. Switching losses are generally associated with the losses which occur while the switch is transitioning between an ON state and an OFF state. When the power switch is conducting, the voltage across the switch and the current conducted by the switch generate conduction losses. Conduction losses are also referenced to as $I^2R$ losses and are proportional to the peak switch current conducted by the power switch. As such, due to the relatively flat peak switch current over a range of switching frequencies of RTM control, the conduction losses at a mid-range switching frequency, typically at "normal" load conditions, are similar to the conduction losses at a higher switching frequency, such as "peak power" load conditions.

For some applications, output power delivery may not be constant. There may be portions of time in which "peak power" is delivered by the power converter. For example, television applications have a "peak power" condition for a short duration. In general, the power converter is designed as if the power converter was operating at "peak power" continuously. For a controller utilizing RTM, this may correspond to switching frequencies around 100 kilohertz (kHz) to meet the peak power conditions. However, efficiency measurements are generally taken at "normal" operation, with switching frequencies around 40 kHz for an RTM controller. Due to the relationship between switching frequency and normalized peak current for RTM control, efficiency may be reduced.

Embodiments of the present disclosure include a controller with an adaptive current limit generator. The controller receives a request signal to turn ON the power switch. The controller turns off the power switch when the switch current of the power switch reaches a current limit. In one example, the current limit can increase and decrease within a current limit range, between a lower threshold LOWER and an upper threshold UPPER. The upper threshold UPPER of the current limit may vary in response to the switching frequency of the power switch. In one example, the upper threshold UPPER of the current limit is varied such that the switching frequency is regulated to a switching frequency threshold $f_{TH}$. In one example, the upper threshold UPPER of the current limit may be selected between a first value VAL1 and a second value VAL2, with the second value VAL2 being greater than the first value VAL1.

As will be shown, in a first mode for lower power requirements (e.g., "normal power" mode), the upper threshold of the current limit is set to the first value VAL1 for switching frequencies that are less than the switching frequency threshold $f_{TH}$, which results in a first graph for the normalized peak switch current with respect to switching frequency. In a second mode for higher power requirements (e.g., "peak power" mode), the upper threshold of the current limit is set to the second value VAL2 for switching frequencies that are greater than the switching frequency threshold $f_{TH}$, which results in a second graph for the normalized peak switch current with respect to switching frequency. In various examples, the upper threshold UPPER of the current limit is configured to transition between the first value VAL1 for the first mode and the second value VAL2 in the second mode at the switch frequency threshold $f_{TH}$. As such, the graph of normalized peak switch current transitions between the graph of the normalized peak switch current for the first mode with the current limit set to the first value VAL1 (e.g., "normal power" mode) for switching frequencies less than the switching frequency threshold $f_{TH}$, and the graph of the normalized peak switch current for second value VAL2 (e.g., "peak power" mode) for switching frequencies greater than the switching frequency threshold $f_{TH}$ in accordance with the teachings of the present invention.

To illustrate, FIG. 1 illustrates a power converter 100 including a first controller 124 (e.g., a primary controller) including an adaptive current limit generator 128 coupled to a driver circuit 126 in accordance with an embodiment of the present disclosure. The illustrated power converter 100 further includes a clamp circuit 112, energy transfer element T1 104, an input winding 106 of the energy transfer element T1 104, an output winding 108 of the energy transfer element T1 104, a power switch SP 110, an input return 111 (which is illustrated with a triangle), an output rectifier DO 114, an output capacitor CO 116, an output return 127 (which is illustrated with three horizontal lines), an output sense circuit 120, a second controller 122 (e.g., secondary controller), and the first controller 124 (e.g., primary controller). A communication link 135 between the second controller 122 and the first controller 124 is also illustrated. As shown, the drive circuit 126 and the adaptive current limit generator 128 of the first controller are coupled to the communication link 135 to receive a request signal REQ 138 from the second controller 122.

Further shown in FIG. 1 are an input voltage $V_{IN}$ 102, a switch drain current $I_D$ 140, an output voltage $V_O$ 130, an output current $I_O$ 132, an output quantity $U_O$ 134, an output sense quantity OS 136, a request signal REQ 138, a second drive signal SR 137, a primary drive signal DR 144, and a current sense signal ISNS 142 representative of the switch drain current $I_D$ 140 through the power switch SP 110.

In the illustrated example, the power converter 100 is shown as having a flyback topology. Further, the input of power converter 100 is galvanically isolated from the output of the power converter 100, such that input return 111 is galvanically isolated from output return 127. Since the input and output of power converter 100 are galvanically isolated, there is no direct current (dc) path across the isolation barrier of energy transfer element T1 104, or between input winding 106 and output winding 108, or between input return 111 and output return 127. It is appreciated that other known topologies and configurations of power converters may also benefit from the teachings of the present disclosure.

The power converter 100 provides output power to a load 118 from an unregulated input voltage $V_{IN}$ 102. In one embodiment, the input voltage $V_{IN}$ 102 is a rectified and filtered ac line voltage. In another embodiment, the input voltage $V_{IN}$ 102 is a dc input voltage. The input voltage $V_{IN}$ 102 is coupled to the energy transfer element 104. In some examples, the energy transfer element 104 may be a coupled inductor, transformer, or an inductor. The energy transfer element 104 is shown as including two windings, input winding 108 (also referred to as a primary winding) and output winding 108 (also referred to as a secondary winding). However, in other examples, the energy transfer element 104 may have more than two windings. The input winding 106 of the energy transfer element 104 is further coupled to the power switch SP 110 and is further coupled to input return 111. Coupled across the input winding 106 is the clamp circuit 112. The clamp circuit 112 limits the voltage on the power switch SP 110.

Output winding 108 is coupled to the output rectifier DO 114, which is exemplified in FIG. 1 as a transistor used as a synchronous rectifier. However, it is appreciated that the transistor used as a synchronous rectifier example shown in FIG. 1 is optional and that in another example, the output rectifier DO 114 may be exemplified as a diode. Output capacitor C0 116 is shown as being coupled to the output rectifier DO 114 and the output return 127. The power converter 100 further includes circuitry to regulate the output quantity $U_O$ 134, which in one example may be the output voltage $V_O$ 130, output current $I_O$ 132, or a combination of the two. The output sense circuit 120 is configured to sense the output quantity $U_O$ 134 to provide a feedback signal or output sense signal OS 136, which is representative of the output of the power converter 100, to the second controller 122.

In the depicted example, the second controller 134 is configured to output the second drive signal SR 137 to control the output rectifier DO 114 and a request signal REQ 138 to the first controller 124 through the communication link 135 in response to the output sense signal OS 136. In one example, the request signal REQ 138 is representative of a power demand for the output of the power converter 100 and the first controller 124 controls the power switch SP 110 in response to the request signal REQ 138. In another example, the second controller 134 is configured to pass along the output sense signal OS 136 to the first controller 124.

As will be described in greater detail below, in one example the request signal REQ 138 includes request events 156 that are representative of a request to turn ON the power switch SP 110 and are generated in response to the output sense signal OS 136. In further embodiments, the request events 156 may be representative of an on-time of the power switch SP 11-. In one example, the second controller 122 is configured to compare the output sense signal OS 136 with a regulation reference. In response to the comparison, the second controller 122 may output the request events 156 in the request signal REQ 138. The request signal REQ 138 may be a rectangular pulse waveform which includes pulses that represent the request events 156. For instance, in the depicted example, the request events 156 are indicated by the pulses in request signal REQ 138 and have a logic high value that quickly returns to a logic low value. In other embodiments it is understood that request signal REQ 138 could be an analog, continually varying signal, rather than a pulsed waveform, while still benefiting from the teachings of the present disclosure.

The second controller 122 and the first controller 124 may communicate via the communication link 135. For the example shown, the second controller 122 is coupled to the secondary side of the power converter 100 and is referenced to the output return 127 while the first controller 123 is coupled to the primary side of the power converter 100 and is referenced to the input return 111. In embodiments, the first controller 124 and the second controller 122 are galvanically isolated from one another and the communication link 135 provides galvanic isolation using an inductive coupling, such as a transformer or a coupled inductor, an optocoupler, capacitive coupling, or other device that maintains the isolation. However, it should be appreciated that in some embodiments, the second controller 122 is not galvanically isolated from the first controller 124. In one example, the communication link 135 may be an inductive coupling formed from a leadframe which supports the first controller 124 and/or the second controller 122.

In one example, the first controller 124 and second controller 122 may be formed as part of an integrated circuit that is manufactured as either a hybrid or monolithic integrated circuit. In one example, the power switch SP 110 may also be integrated in a single integrated circuit package with the first controller 124 and the second controller 122. In addition, in one example, first controller 124 and second controller 122 may be formed as separate integrated circuits. The power switch SP 114 may also be integrated in the same integrated circuit as the first controller 124 or could be formed on its own integrated circuit. Further, it should be appreciated that both the first controller 124, the second controller 122, and power switch SP 110 need not be included in a single package and may be implemented in separate controller packages or a combination of combined/separate packages.

In one example, the power switch SP 110 may be a transistor such as a metal-oxide-semiconductor field-effect transistor (MOSFET), bipolar junction transistor (BT), an insulated-gate bipolar transistor (IGBT a gallium nitride (GaN) based transistor, or a silicon carbide (SiC) based transistor. In another example the power switch SP 110 may be a cascode switch including a normally-on first switch and a normally-off second switch coupled together in a cascode configuration. The first switch may generally be a GaN or SiC based transistor while the second switch may be a MOSFET, BJT, or IGBT.

The first controller 124 is coupled to receive a current sense signal ISNS 142 representative of the switch drain current $I_D$ 140 of the power switch SP 110 and the request signal REQ 138 or output sense signal OS 136 through the communication link 135 and outputs the primary drive signal DR 144 in response. The first controller 132 provides the primary drive signal DR 144 to the power switch SP 110 to control various switching parameters of the power switch SP 110 to control the transfer of energy from the input-side to the output-side of the power converter 100 through the energy transfer element 104 to the output of the power converter 100. Example of such parameters include switching frequency $f_{SW}$ (or switching period $T_{SW}$), duty cycle, on-times and off-times, or varying the number of pulses per unit time of the power switch SP 110. In addition, the power switch SP 110 may be controlled such that it has a fixed switching frequency $f_{SW}$ or a variable switching frequency $f_{SW}$.

In one embodiment, the first controller 124 outputs the primary drive signal DR 144 to control the conduction of the power switch SP 110. In one example, the first controller 132 outputs the primary drive signal DR 144 to turn ON the power switch SP 110 in response to a request event 156 in the request signal REQ 138 or to the information provided by the output sense signal OS 136. In another example, the first controller 124 outputs the primary drive signal DR 144 to turn OFF the power switch SP 110 when the switch drain current $I_D$ 140 represented by the current sense signal ISNS 142 reaches a current limit, such as current limit signal ILIM 148. It should be appreciated that other control methods could be used.

As summarized above, in response to the output sense signal OS 136, the second controller 122 determines whether to turn ON the power switch SP 110 and sends the request events 156 in the request signal REQ 138 to the first controller 124 via the communication link 135. In the depicted example, the request signal REQ 138 includes request events 156, which are representative of requests to turn ON the power switch SP 110. In one example, the request events 156 are pulses in the request signal REQ 138. In response to a request event 156, the first controller 124 is configured to turn ON the power switch SP 110. In one example, the duration between consecutive leading edges or consecutive trailing edges of pulses in the request signal REQ 138 is substantially the switching period $T_{SW}$ of the power switch SP 110. The switching frequency $f_{SW}$ of the power switch SP 110 is substantially the reciprocal of the switching period $T_{SW}$. As such, the request signal REQ 138 is representative of the switching frequency $f_{SW}$ of the power converter 100.

As shown in the depicted example, the drive circuit 126 receives the request signal REQ 138 and the current sense signal ISNS 142, which is representative of the switch drain current $I_D$ 140, and a current limit signal ILIM 148. Drive circuit 126 outputs the drive signal DR 144 to control the turn ON and turn OFF of the power switch SP 110. In one example, the drive signal DR 144 is a rectangular pulse waveform of logic high and logic low sections, logic high corresponding to an ON power switch SP 110 while logic low sections correspond to an OFF power switch SP 110. The duration between consecutive leading edges or consecutive trailing edges in the drive signal DR 144 is substantially the switching period $T_{SW}$ of the power switch SP 110. The drive circuit 126 outputs the drive signal DR 144 to turn ON the power switch SP 110 in response to a received request event 156 in the request signal REQ 138 and outputs drive signal DR 144 to turn OFF the power switch SP 110 when the switch drain current $I_D$ 140 reaches the current limit signal ILIM 148.

As shown in the example, adaptive current limit generator 128 outputs the current limit signal ILIM 148 to the drive circuit 126 in response to the request signal REQ 138 and drive signal DR 144. In operation, the adaptive current limit generator 128 is configured to determine when the power switch SP 110 is turned OFF in response to the drive signal DR 144. The adaptive current limit generator 128 is further configured to determine the switching frequency $f_{SW}$/switching period $T_{SW}$ of the drive signal DR 144 in response to the request signal REQ 138.

In one example, the current limit signal ILIM 148 is a ramping signal which increases and decreases in response to the duration between request events 156 in the request signal REQ 138. The current limit signal ILIM 148 can increase and decrease within a current limit range, between a lower threshold LOWER and an upper threshold UPPER. In one example, the current limit range of current limit signal ILIM 148 may be varied in response to the switching frequency $f_{SW}$. For instance, the upper threshold UPPER of the current limit range may be varied in response to the switching frequency $f_{SW}$. The upper threshold UPPER of the current limit range is varied such that the switching frequency $f_{SW}$ is regulated to a frequency threshold $f_{TH}$. In various examples, the upper threshold UPPER may be varied between a first value VAL1 and a second value VAL2 when the switching frequency $f_{SW}$ is regulated to the frequency threshold $f_{TH}$. In the various examples, when the switching frequency $f_{SW}$ is less than the frequency threshold $f_{TH}$, the upper threshold UPPER is limited to the first value VAL1 such that the power converter 100 operates in a first mode (e.g., "normal power" mode). When the switching frequency $f_{SW}$ is greater than the frequency threshold $f_{TH}$, the upper threshold UPPER is limited to the second value VAL2 such that the power converter 100 operates in a second mode (e.g., "peak power" mode). In the examples, the second value VAL2 is greater than the first value VAL1.

In operation, the current limit signal ILIM 148 output by adaptive current limit generator 128 is a ramp signal that is configured to increase and decrease in response to the power switch SP 110 turning off. The current limit signal ILIM 148 can increase to an upper threshold UPPER. The current limit signal ILIM 148 then decreases until the switch drain current $I_D$ 140 reaches the current limit signal ILIM 148, or the current limit signal ILIM 148 decreases until the current limit signal ILIM 148 reaches the lower threshold LOWER. Thus, at switching frequencies $f_{SW}$ less than a frequency threshold $f_{TH}$, the upper threshold UPPER is substantially the first value VAL1. At switching frequencies $f_{SW}$ greater than a frequency threshold $f_{TH}$, the upper threshold UPPER is substantially the second value VAL2. Further, the upper threshold UPPER is varied such that the switching frequency $f_{SW}$ is regulated to the frequency threshold $f_{TH}$.

Figure 2A:
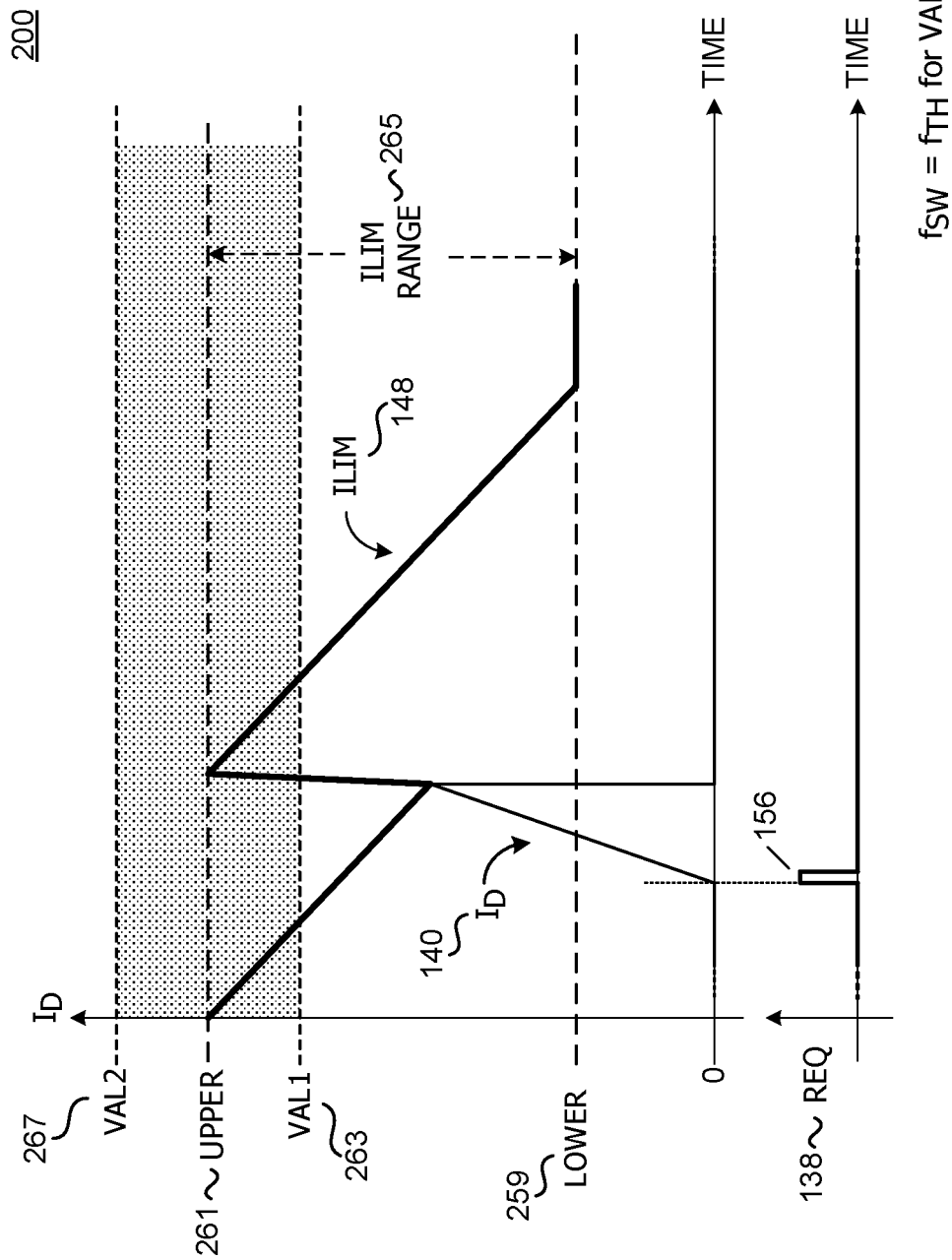
FIG. 2A illustrates an example of a current limit generated by an adaptive current limit generator and a request signal, in accordance with the teachings of the present invention.

To illustrate, FIG. 2A shows an example 200 of the current limit signal ILIM 148 generated by an adaptive current limit generator 128 and the request signal REQ 138, in accordance with the teachings of the present invention. In particular, the example depicted in FIG. 2A illustrates that the current limit signal ILIM 148 decreases to the lower threshold LOWER. The switch drain current $I_D$ 140 is illustrated as a thin solid line while the current limit signal ILIM 148 is shown as a thick solid line in FIG. 2A. The first value VAL1 263 and second value VAL2 267 are shown to illustrate the range over which the upper threshold UPPER 261 may be varied. The current limit range ILIM RANGE 265 is shown as the difference between the upper threshold UPPER 261 and lower threshold LOWER 259. The current limit range ILIM RANGE 265 may increase or decrease depending on the value of the upper threshold UPPER 261, which varies between the first value VAL1 263 and the second value VAL2 267.

In one example, the ratio between the first value VAL1 263 and the second value VAL2 267 may be chosen such that the output power of power converter 100 is substantially double when the upper threshold UPPER 261 is equal to the second value VAL2 267 (e.g., "peak power" mode) as compared to when the upper threshold UPPER 261 is equal to the first value VAL1 263 (e.g., "normal power" mode). The output power is substantially proportional to the squared value of the peak switch current. As such, in one example the first value VAL1 263 is substantially 70% of the second value VAL2 267. As such, the difference between the second value VAL2 267 and the first value VAL1 263 determines the difference in output power or the power delivery provided when the power converter 100 is operating in the two modes.

As shown in FIG. 2A, when a request event 156 in the request signal REQ 138 is received, the power switch SP 110 is turned ON and the switch drain current $I_D$ 140 therefore begins to increase. When the switch drain current $I_D$ 140 reaches the current limit signal ILIM 148, the power switch SP 110 turns OFF and the switch drain current $I_D$ 140 therefore decreases to zero. When the power switch SP 110 turns OFF, the current limit signal ILIM 148 increases to the upper threshold UPPER 261 and then decreases. As shown in the example depicted in FIG. 2A, the current limit signal ILIM 148 decreases to the lower threshold LOWER 259 since another request event 156 has not been received in the request signal REQ 138, which results in no pulse in the switch drain current $I_D$ 140. In various examples, it should be appreciated that the current limit signal ILIM 148 may increase in multiple steps up to the upper threshold UPPER 261.

At switching frequencies $f_{SW}$ less than the frequency threshold $f_{TH}$, the upper threshold UPPER 261 is substantially the first value VAL1 263. At switching frequencies $f_{SW}$ greater than the frequency threshold $f_{TH}$, the upper threshold UPPER 261 is substantially the second value VAL2 267. When the switching frequency $f_{SW}$ is substantially equal to the frequency threshold $f_{TH}$, the upper threshold UPPER 261 is varied within the current limit range ILM RANGE 265 between the first value VAL1 263 and second value VAL2 267, as shown for example in FIG. 2A such that the switching frequency $f_{SW}$ is regulated to the frequency threshold $f_{TH}$.

Figure 2B:
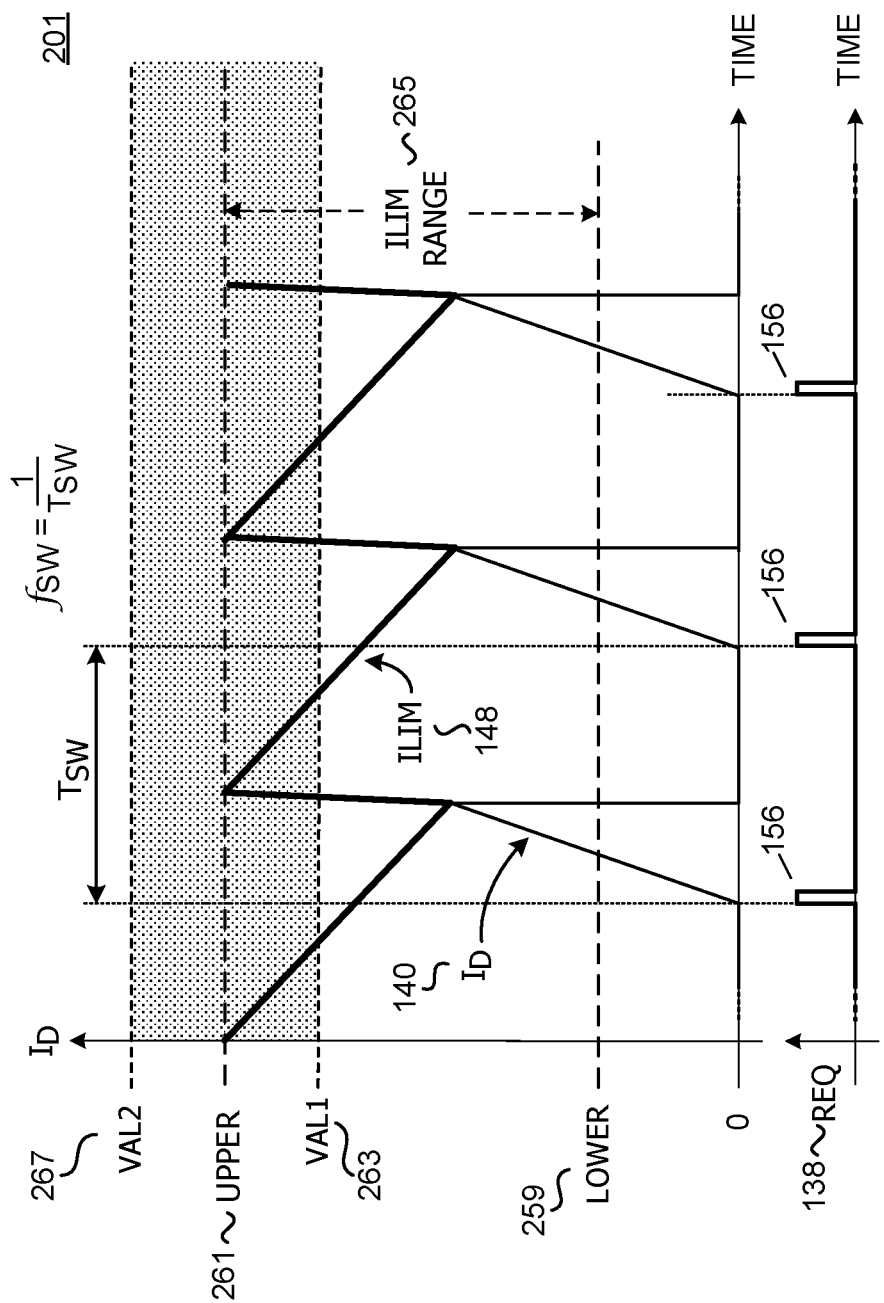
FIG. 2B illustrates another example of a current limit generated by an adaptive current limit generator and a request signal, in accordance with the teachings of the present invention.

FIG. 2B illustrates another example 201 of the current limit signal ILIM 148 generated by the adaptive current limit generator 128 and the request signal REQ 138, in accordance with the teachings of the present invention. In particular, the example depicted in FIG. 2B illustrates the example in which the power switch SP 110 is turned ON producing a switch drain current $I_D$ 140 such that the current limit signal ILIM 148 decreases until the switch drain current $I_D$ 140 reaches the current limit signal ILIM 148.

As shown, when a request event 156 in the request signal REQ 138 is received, the power switch SP 110 is turned ON and the switch drain current $I_D$ 140 therefore begins to increase. When the switch drain current $I_D$ 140 reaches the current limit signal ILIM 148, the power switch SP 110 turns OFF and the switch drain current $I_D$ 140 therefore decreases to zero. When the power switch SP 100 turns OFF, the current limit signal ILIM 148 increases up to the upper threshold UPPER 261 and then decreases. As shown, the current limit signal ILIM 148 decreases until the switch drain current $I_D$ 140 reaches the current limit signal ILIM 148. Once the switch drain current $I_D$ 140 reaches the current limit signal ILIM 148, the current limit signal ILIM 148 increases to the upper threshold UPPER 261. As shown, the duration of time between leading edges of the request signal REQ 156 is the switching period $T_{SW}$. In other words, the duration of time between consecutive turn ONs of the power switch SP 110 is substantially the switching period $T_{SW}$ and the switching frequency $f_{SW}$ is the reciprocal of the switching period $T_{SW}$.

At switching frequencies $f_{SW}$ less than the frequency threshold $f_{TH}$, the upper threshold UPPER 261 is substantially the first value VAL1 263 (e.g., "normal power" mode). At switching frequencies $f_{SW}$ greater than the frequency threshold $f_{TH}$, the upper threshold UPPER 261 is substantially the second value VAL2 267 (e.g., "peak power" mode). When the switching frequency $f_{SW}$ is substantially the frequency threshold $f_{TH}$, the upper threshold UPPER 261 is varied within the current limit range ILM RANGE 265 between the first value VAL1 263 and second value VAL2 267, as shown for example in FIG. 2B, such that the switching frequency $f_{SW}$ is regulated to the frequency threshold $f_{TH}$.

Figure 3:
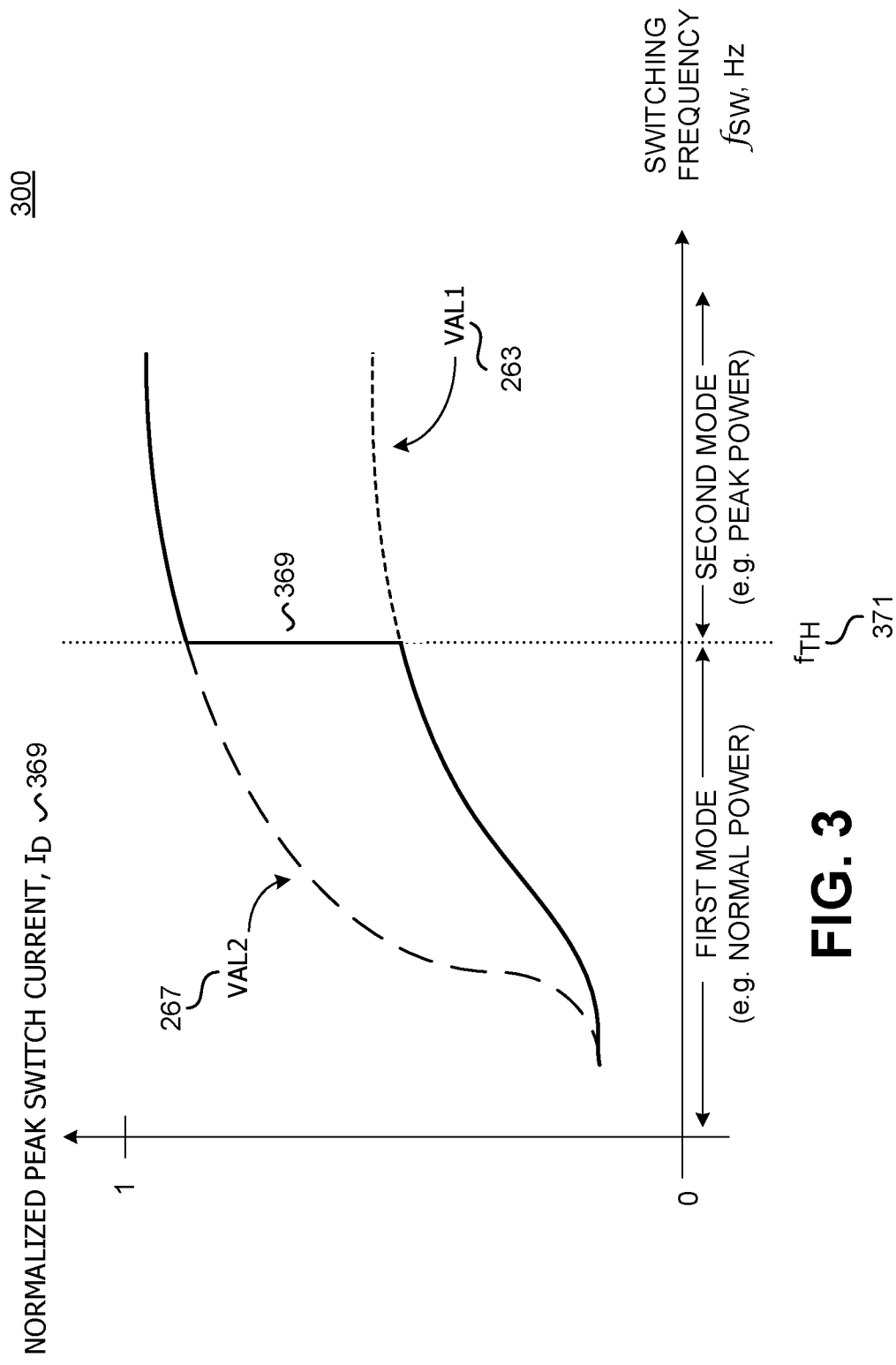
FIG. 3 is a graph illustrating example graphs of normalized peak switch current relative to first and second values VAL1 and VAL2 with respect to switching frequency, in accordance with the teachings of the present invention.

FIG. 3 illustrates an example of a graph 300 showing a normalized peak switch current $I_D$ 369 relative to peak current curves for the first and second values VAL1 263 and VAL2 267 with respect to switching frequency $f_{SW}$ in accordance with the teachings of the present invention. In the depicted example, the normalized peak switch current $I_D$ 369 is illustrated with a dark solid line. As shown, for switching frequencies $f_{SW}$ that are less than a frequency threshold $f_{TH}$ 371, the normalized peak switch current $I_D$ 369 substantially overlaps with or follows a peak current curve for the first value VAL1 263. In the example shown in FIG. 3, the peak current curve for the first value VAL1 263 is represented with the small dashed line curve. In the various examples, the power converter may be considered to be operating in a first mode (e.g., "normal power" mode) while the normalized peak switch current $I_D$ 369 substantially overlaps with or follows the peak current curve for the first value VAL1 263. As discussed above in FIGS. 2A-2B, the first value VAL1 263 corresponds with the lower range value of the current limit range ILM RANGE 265.

For switching frequencies $f_{SW}$ that are greater than the frequency threshold $f_{TH}$ 371, the normalized peak switch current $I_D$ 369 substantially overlaps with or follows the peak current curve for the second value VAL2 267. In the example shown in FIG. 3, the peak current curve for the second value VAL2 267 is represented with the large dashed line curve. In the various examples, the power converter may be considered to be operating in a second mode (e.g., "peak power" mode) while the normalized peak switch current $I_D$ 369 substantially overlaps with or follows the peak current curve for the second value VAL2 267. As discussed above in FIGS. 2A-2B, the second value VAL2 267 corresponds with the upper range value of the current limit range ILM RANGE 265.

As shown in the example depicted in FIG. 3, for the switching frequency $f_{SW}$ substantially equal the frequency threshold $f_{TH}$ 371, the upper threshold UPPER 261 is varied in the current limit range ILM RANGE 265 between the first value VAL1 263 and second value VAL2 267 such that the normalized peak switch current $I_D$ 369 is regulated to transition between the peak current curve for the first value VAL1 263 (small dashed line in FIG. 3) and the peak current curve for the first value VAL2 267 (large dashed line in FIG. 3) at the frequency threshold $f_{TH}$ 371. In various examples, it is appreciated that the upper threshold UPPER 261 may transition between the first value VAL1 263 and second value VAL2 267 in multiple steps in order to regulate the normalized peak switch current $I_D$ 369 between the first and second modes (e.g., between the "normal power" and "peak power" modes) at the frequency threshold $f_{TH}$ 371.

In various examples, it is appreciated that faster switching frequencies $f_{SW}$ generally correspond with larger output loads 118 coupled to the power converter 100. As shown, for both the first value VAL1 263 and second value VAL2 267 curves there is a steeper slope portion at lower switching frequencies $f_{SW}$ with the slope reducing at mid to higher switching frequencies $f_{SW}$. The normalized peak switch current $I_D$ 369 for the large dashed line curve is greater than the small dashed curve, illustrating the larger output power capability at the second value VAL2 267 (e.g., "peak power" mode). However, conduction losses are greater for the large dashed line curve (second value VAL2 267) as compared to the small dashed line curve (first value VAL1 263) when the switching frequency $f_{SW}$ is less than the frequency threshold $f_{TH}$ 371.

Thus, the normalized peak switch current $I_D$ 369 as represented in FIG. 3 with the dark solid line illustrates an example operation of a controller in accordance with embodiments of the present disclosure. At switching frequencies $f_{SW}$ greater than frequency threshold $f_{TH}$ 371, the normalized peak switch current $I_D$ 369 shows that the controller is configured to operate as indicated with the large dashed line curve (e.g., upper threshold UPPER 261=second value VAL2 267), which enables the controller to provide more output power as compared to if the controller was operating in the small dashed curve (e.g., upper threshold UPPER 261=first value VAL1 263).

Therefore, as summarized above, the region of operation with switching frequencies $f_{SW}$ greater than the frequency threshold $f_{TH}$ 371 may be considered the "peak power" (e.g., second mode) region where the power converter 100 is configured to provide "peak power" for a small duration. The region of operation with switching frequencies $f_{SW}$ below the frequency threshold $f_{TH}$ 371 may be considered the "normal power" (e.g., first mode) region where the power converter 100 is configured to operate as indicated with the small dashed curve (e.g., upper threshold UPPER 261=first value VAL1 263), which enables the power converter 100 to operate with smaller conduction losses, which increases efficiency as compared to the large dashed curve (e.g., upper threshold UPPER 261=second value VAL2 267). As mentioned, when the power converter 100 is regulated at the frequency threshold $f_{TH}$ 371, the upper threshold UPPER 261 of current limit range ILIM RANGE 265 may be varied between the first value VAL1 263 (e.g., "normal power" mode) and the second value VAL2 267 (e.g., "peak power" mode) to regulate the normalized peak switch current $I_D$ 369 with the switching frequency $f_{SW}$ at the frequency threshold $f_{TH}$ 371 between "normal power" and "peak power" modes.

In one example, the frequency threshold $f_{TH}$ 371 is substantially 80 kHz. However, in other examples it should be appreciated that the frequency threshold $f_{TH}$ 371 may be selected or trimmed by a user. For instance, in various examples the frequency threshold $f_{TH}$ 371 may be 80 kHz, 100 kHz, or 110 kHz, and the selection may be determined by the frequency generally selected by designers to operate a power converter to provide full power to a load.

Figure 4:
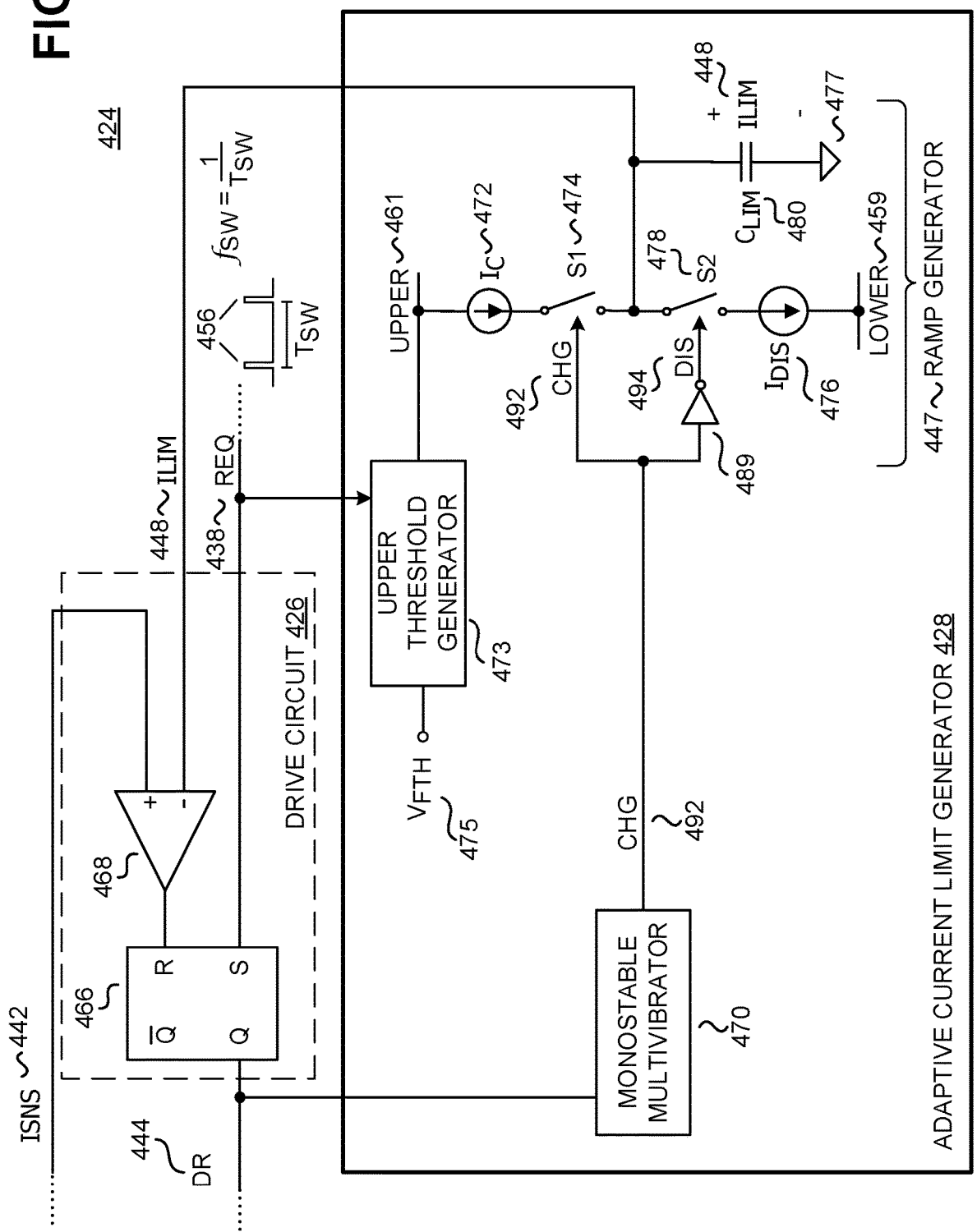
FIG. 4 illustrates an example first controller included in a switched mode power converter, in accordance with the teachings of the present invention.

FIG. 4 illustrates one example of a first controller 424 included in a switched mode power converter, in accordance with the teachings of the present invention. It is appreciated that the first controller 424 of FIG. 4 may be an example showing greater detail of the first controller 124 as shown in FIG. 1, and that similarly named and numbered elements described above are coupled and function similarly below.

As shown in the example depicted in FIG. 4, first controller 424 includes a drive circuit 426 and an adaptive current limit generator 428. In the example, drive circuit 426 is shown as including the comparator 468 and latch 466. The comparator 468 receives the current limit signal ILIM 448 and the current sense signal ISNS 442, which is representative of the switch current $I_D$ 140. As shown, the comparator 468 receives the current limit signal ILIM 448 at its inverting input and the current sense signal ISNS 442 at its non-inverting input. As shown in the depicted example, latch 466 is coupled to receive the request signal REQ 438 and the output of the comparator 468. In particular, the request signal REQ 438 is received at the set input S of the latch 466 while the output of comparator 468 is received at the reset input R of the latch 466. The Q output of the latch 466 is shown as the primary drive signal DR 444.

In operation, the drive circuit 426 outputs a logic high value for the primary drive signal DR 444 at the Q output of the latch 466 when a request event 456 is received in the request signal REQ 438, which sets latch 466. The primary drive signal DR 444 transitions to a logic low value when the comparator 468 detects that switch drain current $I_D$ 140 as represented by the current sense signal ISNS 442 reaches the current limit signal ILIM 448, which resets the latch 466.

The example adaptive current limit generator 428 as depicted in FIG. 4 is shown as including a monostable multivibrator 470 (e.g., one shot), an upper threshold generator 473, and a ramp generator 447, which includes a charging current source $I_C$ 472, a discharging current source $I_{DIS}$ 476, an inverter 489, and a capacitor $C_{LIM}$ 480.

As shown in the illustrated example, upper threshold generator 473 is coupled to receive the request signal REQ 438 and a threshold signal $V_{FTH}$ 475, which is representative of the frequency threshold $f_{TH}$ 371. In one example, the threshold signal $V_{FTH}$ 475 is a voltage signal. As will be discussed in greater detail below, upper threshold generator 473 is configured to generate the upper threshold UPPER 461 in response to the request signal REQ 438 and the threshold signal $V_{FTH}$ 475.

Monostable multivibrator 470 is configured to receive the primary drive signal DR 444 and output a charge signal CHG 492 to the ramp generator 447. In one example, the charge signal CHG 492 is a rectangular pulse of a fixed duration that is asserted in the charge signal CHG 492 in response to the primary drive signal DR 444. In one example, the monostable multivibrator 470 outputs the charge signal CHG 492 in response to the primary drive signal DR 444 indicating a turn OFF of the power switch SP 110. In operation, the pulse of fixed duration is asserted in charge signal CHG 492 by monostable multivibrator 470 in response to a trailing edge in the primary drive signal DR 444.

Inverter 489 of the ramp generator 447 receives the charge signal CHG 492 and outputs the discharge signal DIS 494. It should be appreciated that the discharge signal DIS 494 is the inverted charge signal CHG 492.

Switch S1 474 is configured to be controlled by the charge signal CHG 492 while switch S2 478 is configured to be controlled by the discharge signal DIS 494. When the charge signal CHG 492 is asserted, the switch S1 474 is turned ON and capacitor $C_{LIM}$ 480 is charged by current source $I_C$ 472 and the voltage across the capacitor $C_{LIM}$ 480 increases. The voltage across the capacitor $C_{LIM}$ 480 is the current limit signal ILIM 448. As shown, the current source $I_C$ 472 is coupled between the upper threshold UPPER 461 and the switch S1 474. Therefore, the maximum value to which the capacitor $C_{LIM}$ 480 is charged to is the upper threshold UPPER 461, which is output by the upper threshold generator 473. In other words, the maximum value which the current limit signal ILIM 448 may reach is determined by the upper threshold UPPER 461.

After the fixed duration of the pulse provided by the monostable multivibrator 470, charge signal CHG 492 is deasserted and discharge signal DIS 494 is asserted. When the discharge signal DIS 494 is asserted, the switch S2 478 is turned ON and the capacitor $C_{LIM}$ 480 is discharged by current source $I_{DIS}$ 476 and the voltage across the capacitor $C_{LIM}$ 480 (e.g., current limit signal ILIM 448) decreases. As shown, the current source $I_{DIS}$ 476 is coupled between switch S2 478 and the lower threshold LOWER 459. Therefore, the voltage across the capacitor CUM 480 (e.g., current limit signal ILIM 448) decreases until the switch drain current $I_D$ 140 as represented by the current sense signal ISNS 442 reaches the current limit signal ILIM 448 or the voltage across the capacitor $C_{LIM}$ (e.g., current limit signal ILIM 448) reaches the lower threshold LOWER 459.

The upper threshold generator 473 is configured to receive the request signal REQ and the threshold signal $V_{FTH}$ 475 representative of the frequency threshold $f_{TH}$ 371. The upper threshold generator 473 determines the switching frequency $f_{SW}$ from the request signal REQ 438 and varies the upper threshold UPPER 461. It should be appreciated that the upper threshold generator 473 may determine the switching frequency $f_{SW}$ from other signals, such as the drive signal DR 444. At switching frequencies $f_{SW}$ less than a frequency threshold $f_{TH}$ 371, the upper threshold UPPER 461 is substantially the first value VAL1 263. At switching frequencies $f_{SW}$ greater than a frequency threshold $f_{TH}$, the upper threshold UPPER 461 is substantially the second value VAL2 267. When the switching frequency $f_{SW}$ is substantially the frequency threshold $f_{TH}$ 371, the upper threshold UPPER 461 is varied between the first value VAL1 263 and the second value VAL2 267 such that the switching frequency $f_{SW}$ is regulated to the frequency threshold $f_{TH}$ 371.

Figure 5A:
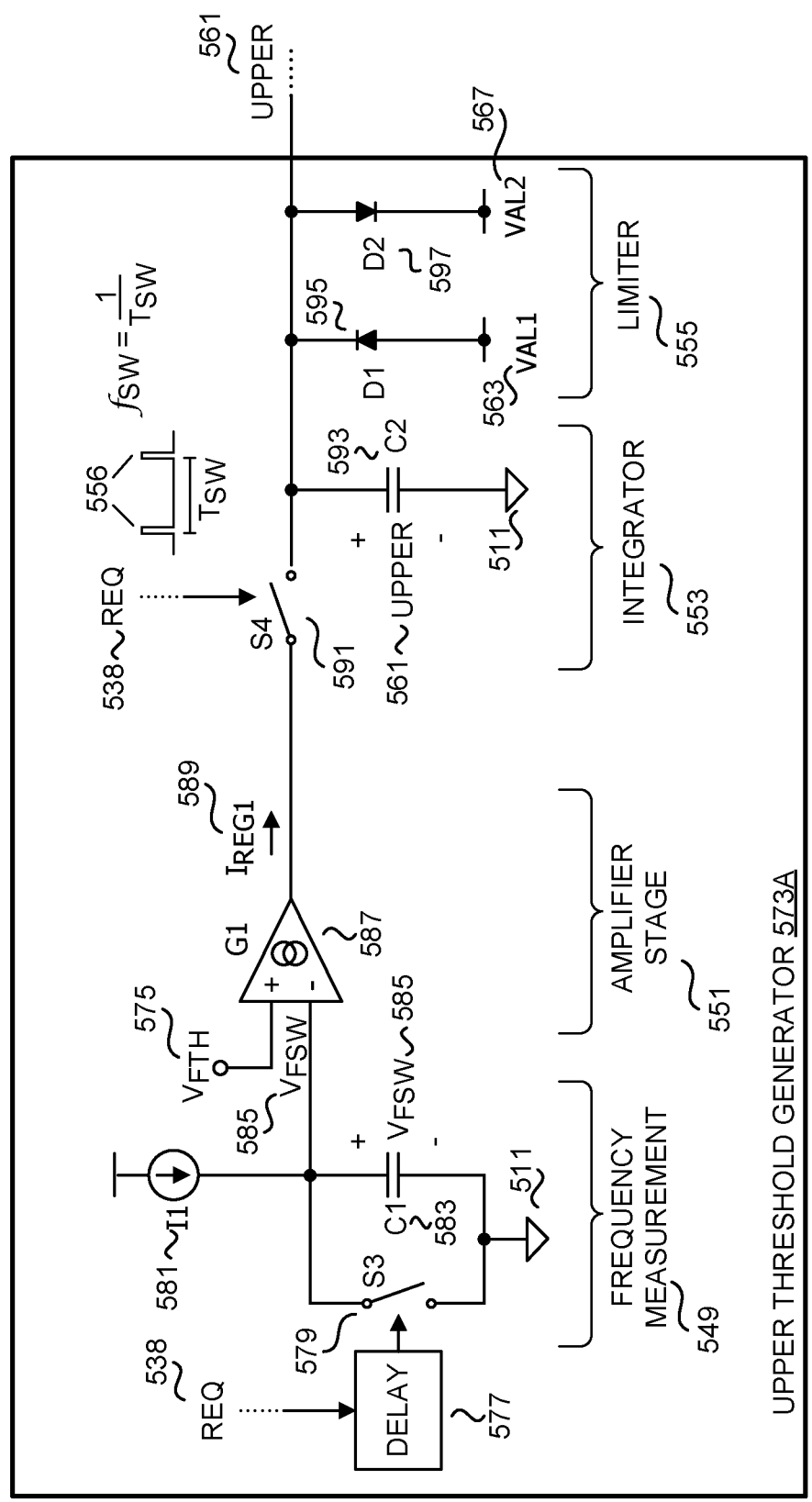
FIG. 5A illustrates one example of an upper threshold generator included in an example first controller of a switched mode power converter, in accordance with the teachings of the present invention.

FIG. 5A illustrates one example of an upper threshold generator 573A included in an example first controller of a switched mode power converter, in accordance with the teachings of the present invention. It is appreciated that the upper threshold generator 573A of FIG. 5A may be an example of the upper threshold generator 473 as shown in FIG. 4, and that similarly named and numbered elements described above are coupled and function similarly below.

As shown in the depicted example, upper threshold generator 573A includes a frequency measurement circuit 549, which includes a current source I1 581, a capacitor C1 583, and a switch S3 579. The frequency measurement circuit 549 is configured to measure the switching frequency $f_{SW}$ of the primary power switch SP 110. It should be appreciated that by measuring the switching frequency $f_{SW}$ of the primary power switch SP 110, the frequency measurement circuit 549 also measures the switching period $T_{SW}$ of the primary power switch SP 110, which is the reciprocal of the switching frequency $f_{SW}$. A request event 556 in request signal REQ 538 turns ON the switch S3 579 to discharge capacitor C1 583. In the depicted example, the switch S3 578 is configured to turn ON in response to the request signal REQ 538 after a delay determined by a delay circuit 577 coupled to switch S3 579 as shown. Capacitor C1 583 is then charged by a current source I1 581 to measure the switching frequency $f_{SW}$/switching period $T_{SW}$ of the primary power switch SP 110. The switching frequency voltage $V_{FSW}$ 585 across the capacitor C1 583, also referred to as the switching frequency signal $V_{FSW}$ 585, is therefore representative of the switching frequency $f_{SW}$/switching period $T_{SW}$.

It should be appreciated that the faster the switching frequency $f_{SW}$, the shorter the switching period $T_{SW}$, and the smaller the switching frequency voltage $V_{FSW}$ 585 across capacitor C1 583. Stated in another way, the slower the switching frequency $f_{SW}$, the longer the switching period $T_{SW}$, and the larger the switching frequency voltage $V_{FSW}$ 585 across capacitor C1 583 since there is more time for the current source I1 581 to charge the capacitor C1 583. As such, a larger switching frequency voltage $V_{FSW}$ 585 corresponds with slower switching frequencies $f_{SW}$.

As shown in the example depicted in FIG. 5A, an amplifier stage 551 is coupled to receive the switching frequency voltage $V_{FSW}$ 585 representative of the switching frequency $f_{SW}$/switching period $T_{SW}$ and a threshold signal $V_{FTH}$ 575 that is representative of the frequency threshold $f_{TH}$ 371. In the example shown, the threshold signal $V_{FTH}$ 575 is a voltage representative of the frequency threshold $f_{TH}$ 371. The amplifier stage 551 is configured to generate a current $I_{REG1}$ 589 in response to the switching frequency voltage $V_{FSW}$ 585 and the voltage $V_{FTH}$ 575. In the depicted example, the amplifier stage 551 includes a transconductance amplifier G1 587 that compares the switching frequency voltage $V_{FSW}$ 585 representative of the switching frequency $f_{SW}$/switching period $T_{SW}$ with the voltage $V_{FTH}$ 575 that is representative of the frequency threshold $f_{TH}$ 371 to generate the output current $I_{REG1}$ 589. For the example shown, the transconductance amplifier G1 587 has a positive gain. The direction and magnitude of the output current $I_{REG1}$ 589 of the amplifier stage 551 is determined by or varies in response to the difference between switching frequency voltage $V_{FSW}$ 585 and voltage $V_{FTH}$ 575. As shown, the switching frequency voltage $V_{FSW}$ 585 is received at the inverting input of the transconductance amplifier G1 587 while the voltage $V_{FTH}$ 575 is received at the non-inverting input of the transconductance amplifier G1 587. If the voltage $V_{FTH}$ 575 is greater than the between switching frequency voltage $V_{FSW}$ 585, the transconductance amplifier G1 587 provides current $I_{REG1}$ 589 to charge capacitor C2 593. If the voltage $V_{FTH}$ 575 is less than the than the voltage $V_{FTH}$ 575, the transconductance amplifier G1 587 pulls current $I_{REG1}$ 589 to discharge capacitor C2 593.

If the switching frequency voltage $V_{FSW}$ 585 is less than the voltage $V_{FTH}$ 575, this indicates that the switching frequency $f_{SW}$ is greater than the frequency threshold $f_{TH}$ 371. The transconductance amplifier G1 sources current $I_{REG1}$ 589 to switch S4 591 and capacitor C2 593 such that the capacitor C2 593 is charged. The voltage across capacitor C2 593 is the upper threshold UPPER 561. As such, the upper threshold UPPER 561 increases.

If the switching frequency voltage $V_{FSW}$ 585 is greater than the voltage $V_{FTH}$ 575, this indicates that the switching frequency $f_{SW}$ is less than the frequency threshold $f_{TH}$ 371. The transconductance amplifier G1 587 sinks current $I_{REG1}$ 589 from switch S4 591 and capacitor C2 593 such that the capacitor C2 593 is discharged. As such, the upper threshold UPPER 561 decreases.

In the depicted example, switch S4 591 and capacitor C2 593 form an integrator 553. Switch S4 591 is controlled by the request signal REQ 538. A received request event 556 in the request signal REQ 538 acts as an update signal and the switch S4 591 is turned ON and capacitor C2 593 is either charged or discharged with the current $I_{REG1}$ 589 depending on whether the switching frequency voltage $V_{FSW}$ 585 is less than or greater than the voltage $V_{FTH}$ 575 as determined by transconductance amplifier G1 587 of amplifier stage 551. As such, the upper threshold UPPER 561 across capacitor C2 593 may be varied to regulate the switching frequency $f_{SW}$ to the frequency threshold $f_{TH}$ 371. It should be appreciated that the delay between turning on switch S4 591 and turning on switch S3 579 as determined by delay circuit 577 has a sufficient duration such that the capacitor C2 593 has sufficient time to update before switch S3 579 resets the measurement of the switching frequency $f_{SW}$/switching period $T_{SW}$ on capacitor C1 583.

Diode D1 595 and diode D2 597 are included in a limiter 555 that is coupled to the capacitor C2 593. As shown, the anode of diode D1 595 is coupled to the first value VAL1 563 and the cathode of D1 595 is coupled to capacitor C2 593. The anode of diode D2 597 is coupled to capacitor C2 593 and the cathode of diode D2 597 is coupled to the second value VAL2 567. As such, the voltage across capacitor C2 593 (e.g. upper threshold UPPER 561) is limited or not charged to a value greater than second value VAL2 567 or discharged to a value less than the first value VAL1 563.

Figure 5B:
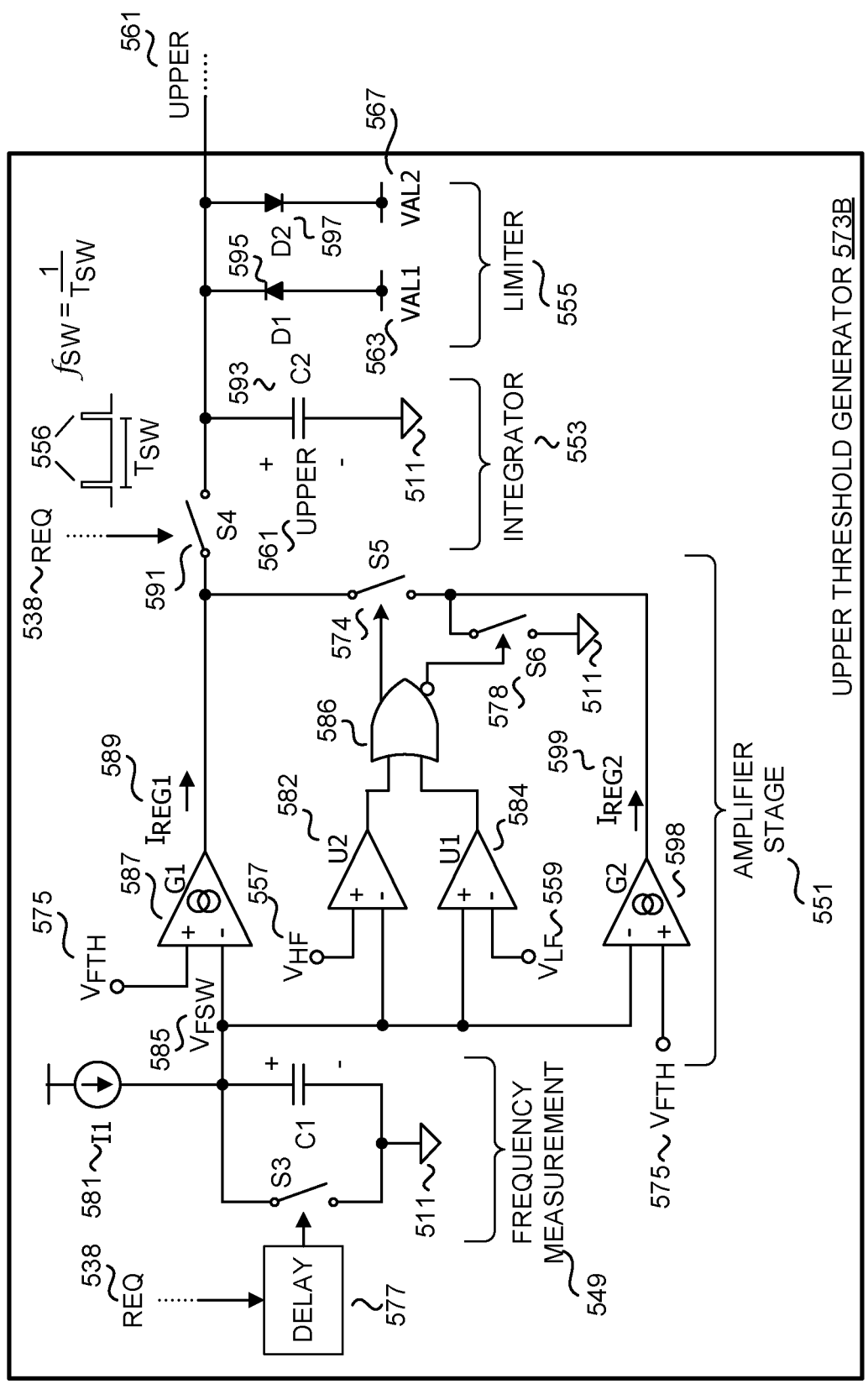
FIG. 5B illustrates another example of an upper threshold generator included in an example first controller of a switched mode power converter, in accordance with the teachings of the present invention.

FIG. 5B illustrates another example of an upper threshold generator 573B included in an example first controller of a switched mode power converter, in accordance with the teachings of the present invention. It is appreciated that the upper threshold generator 573B of FIG. 5B may be another example of the upper threshold generator 473 as shown in FIG. 4, and that similarly named and numbered elements described above are coupled and function similarly below. It is appreciated that the example upper threshold generator 573B of FIG. 5B shares some similarities with the example upper threshold generator 573A shown in FIG. 5A with an additional variable gain stage for the transconductance amplifier in the amplifier stage 551 as will be shown below.

For instance, as shown in the example depicted in FIG. 5B, the amplifier stage 551 of upper threshold generator 573B also includes a second transconductance amplifier G2 598 that is also coupled to the capacitor C1 583 of the frequency measurement circuit 549 to receive the switching frequency voltage $V_{FSW}$ 585 representative of the switching frequency $f_{SW}$/switching period $T_{SW}$. Second transconductance amplifier G2 598 is also coupled to receive the voltage $V_{FTH}$ 575 that is representative of the frequency threshold $f_{TH}$ 371. As shown, the switching frequency voltage $V_{FSW}$ 585 is received at the inverting input of the second transconductance amplifier G2 598 while the voltage $V_{FTH}$ 575 is received at the non-inverting input of the second transconductance amplifier G2 598. For the example shown, the second transconductance amplifier G2 598 has a positive game. Similar to the transconductance amplifier G1 587, the second transconductance amplifier G2 598 also compares the switching frequency voltage $V_{FSW}$ 585 representative of the switching frequency $f_{SW}$/switching period $T_{SW}$ with the voltage $V_{FTH}$ 575 that is representative of the frequency threshold $f_{TH}$ 371 and provides the current $I_{REG2}$ 599. The direction and magnitude of the current $I_{REG2}$ 599 is determined by or varies in response to the difference between switching frequency voltage $V_{FSW}$ 585 and voltage $V_{FTH}$ 575. Transconductance amplifier G2 598 sources current $I_{REG2}$ 599 to capacitor C2 593 of the integrator 553 such that capacitor C2 593 is charged and upper threshold UPPER 561 increases when the switching frequency voltage $V_{FSW}$ 585 is substantially less than the voltage $V_{FTH}$ 575 (e.g. the switching frequency $f_{SW}$ is substantially greater than the frequency threshold $f_{TH}$). Further, the second transconductance amplifier G2 598 sinks current $I_{REG2}$ 599 away from capacitor C2 593 such that capacitor C2 593 is discharged and upper threshold UPPER 561 decreases when the switching frequency voltage $V_{FSW}$ 585 is substantially greater than the voltage $V_{FTH}$ 575 (e.g. the switching frequency $f_{SW}$ is substantially less than the frequency threshold $f_{TH}$).

However, the transconductance amplifier G2 598 does not source or sink current for the amplifier stage 551 unless the switching frequency voltage $V_{FSW}$ 585 that is representative of the switching frequency $f_{SW}$/switching period $T_{SW}$ is greater than a lower frequency voltage $V_{LF}$ 559 and less than a higher frequency voltage $V_{HF}$ 557. In one example, voltage $V_{LF}$ 559 is representative of a frequency for increased gain which is less than the frequency threshold $f_{TH}$ 371 while voltage $V_{HF}$ 557 is representative of a frequency for increased gain which is greater than the frequency threshold $f_{TH}$ 371. It should be appreciated that the voltage $V_{LF}$ 559 is greater than the voltage $V_{FTH}$ 575 which is greater than the voltage $V_{HF}$ 557, or mathematically $V_{LF} > V_{FTH} > V_{HF}$.

As such, the example amplifier stage 551 depicted in FIG. 5B further includes a comparator U1 584, a comparator U2 582, an OR gate 586, a switch S5 574, and a switch S6 578. Comparator U1 584 is shown as receiving the lower frequency voltage $V_{LF}$ 559 at its inverting input and the switching frequency voltage $V_{FSW}$ 585 at its non-inverting input. Comparator U2 582 is shown as receiving the higher frequency voltage $V_{HF}$ 557 at its non-inverting input and the switching frequency voltage $V_{FSW}$ 585 at its inverting input.

The outputs of comparator U1 584 and comparator U2 582 are received by OR gate 586. The non-inverting output of the OR gate 586 controls the turn ON and turn OFF of switch S5 574 while the inverting output of OR gate 586 controls the turn ON and turn OFF of switch S6 578. Switch S5 574 is shown as being coupled between switch S4 591 of the integrator 553 and the output of transconductance amplifier G2 598. Switch S6 578 is shown as being coupled between the output of transconductance amplifier G2 598 and input return 511.

In operation, if the switching frequency voltage $V_{FSW}$ 585 representative of the switching frequency $f_{SW}$/switching period $T_{SW}$ is less than the voltage $V_{LF}$ 559 and greater than the voltage $V_{HF}$ 557 (e.g., $V_{HF} < V_{FSW} < V_{LF}$), the switching frequency $f_{SW}$ is relatively close to the frequency threshold $f_{TH}$ 371 and therefore only the transconductance amplifier G1 587 is utilized to charge or discharge capacitor C2 593 and vary the upper threshold UPPER 561. In other words, if the switching frequency voltage $V_{FSW}$ 585 representative of the switching frequency $f_{SW}$/switching period $T_{SW}$ is less than the voltage $V_{LF}$ 559 and greater than the voltage $V_{HF}$ 557 (e.g., $V_{HF} < V_{FSW} < V_{LF}$), the outputs of both comparator U1 584 and comparator U2 582 are low, the non-inverting output of OR gate 586 gate is low and the switch S5 574 is OFF. The inverting output of OR gate 586 is high and switch S6 578 is ON, and the current $I_{REG2}$ 599 is directed to input return 511 and not included in the output current of amplifier stage 551 to charge or discharge capacitor C2 593.

If the switching frequency voltage $V_{FSW}$ 585 representative of the switching frequency $f_{SW}$/switching period $T_{SW}$ is greater than the voltage $V_{LF}$ 559 (e.g. $V_{FSW} > V_{LF}$), this indicates that the switching frequency $f_{SW}$ is much lower or substantially lower than the frequency threshold $f_{TH}$ 371 and the additional current $I_{REG2}$ 599 provided by the transconductance amplifier G2 598 may be utilized to quickly bring the switching frequency $f_{SW}$ back into regulation. The output of comparator U1 584 is high, the non-inverting output of OR gate 586 is high while the inverting output of OR gate 586 is low. As such, switch S5 574 is closed and switch S6 578 is open. The switching frequency voltage $V_{FSW}$ 585 is greater than the voltage $V_{FTH}$ 575 and output current of the amplifier stage 551 that is pulled from the capacitor C2 593 includes both the current $I_{REG1}$ 589 and the current $I_{REG2}$ 599 provided by both transconductance amplifier G1 587 and transconductance amplifier G2 598. In other words, transconductance amplifier G1 587 and transconductance amplifier G2 598 both sink current from capacitor C2 593 and capacitor C2 593 is discharged. The upper threshold UPPER 561 voltage across the capacitor C2 593 therefore decreases quicker than if only the transconductance amplifier G1 589 was utilized.

If the switching frequency voltage $V_{FSW}$ 585 representative of the switching frequency $f_{SW}$/switching period $T_{SW}$ is less than the voltage $V_{HF}$ 557 (e.g., $V_{FSW} < V_{HF}$), this indicates that the switching frequency $f_{SW}$ is much greater or substantially greater than the frequency threshold $f_{TH}$ 371 and the additional current $I_{REG2}$ 599 provided by the transconductance amplifier G2 598 may be utilized to quickly bring the switching frequency $f_{SW}$ back into regulation. The output of comparator U2 582 is high, the non-inverting output of OR gate 586 is high while the inverting output of OR gate 586 is low. As such, switch S5 574 is closed and switch S6 578 is open. The switching frequency voltage $V_{FSW}$ 585 is less than the voltage $V_{FTH}$ 575 and output current of the amplifier stage 551 provided to the capacitor C2 593 of the integrator 553 by both transconductance amplifier G1 587 and transconductance amplifier G2 598 includes current $I_{REG1}$ 589 and current $I_{REG2}$ 599. In other words, transconductance amplifier G1 587 and transconductance amplifier G2 598 both source current to capacitor C2 593 and capacitor C2 593 is charged. The upper threshold UPPER 561 voltage across the capacitor C2 593 increases quicker than if only the transconductance amplifier G1 587 was utilized.

As an example, voltage $V_{FTH}$ 575 may be representative of 80 kHz while higher frequency voltage $V_{HF}$ 557 may be representative of 100 kHz and lower frequency voltage $V_{LF}$ 559 may be representative of 65 kHz. If the switching frequency $f_{SW}$ is greater than 65 kHz but less than 100 kHz, switch S5 574 is open while switch S6 578 is closed, and the transconductance amplifier G1 587 is used to pull or push current $I_{REG1}$ 589 to discharge or charge capacitor C2 593. If the switching frequency $f_{SW}$ is less than 65 kHz, both the transconductance amplifier G1 587 and transconductance amplifier G2 598 are used to pull current $I_{REG1}$ 589 and $I_{REG2}$ 599 to discharge capacitor C2 593 and decrease the upper threshold UPPER 561. If the switching frequency $f_{SW}$ is greater than 100 kHz, both transconductance amplifier G1 587 and transconductance amplifier G2 598 are used to push current $I_{REG1}$ 589 and $I_{REG2}$ 599 to charge capacitor C2 593 to increase the upper threshold UPPER 561. Diode D1 595 and diode D2 597 of the limiter 555 are coupled to the capacitor C2 593 and limit the voltage across capacitor C2 593 (e.g. upper threshold UPPER 561) such that capacitor C2 593 is not charged to a value greater than second value VAL2 567 or discharged to a value less than the first value VAL1 563.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1. A controller for a power converter, comprising a drive circuit coupled to receive a request signal representative of a power demand of an output of the power converter, wherein the drive circuit is configured to generate a drive signal to control switching of a power switch to a control a transfer of energy from an input-side of the power converter to an output-side of the power converter, wherein the drive circuit is configured to control the power switch in response to the request signal; and an adaptive current limit generator configured to generate a current limit signal in response to the drive signal and the request signal, wherein the drive circuit is configured to turn off the power switch when a current sense signal representative of a current through the power switch reaches the current limit signal, wherein the adaptive current limit generator is configured to vary an upper threshold of a current limit range of the current limit signal to a first value when a switching frequency of the power switch is less than a frequency threshold, and vary the upper threshold of the current limit range of the current limit signal to a second value when a switching frequency of the power switch is greater than the frequency threshold, wherein the second value is greater than the first value.

Example 2. The controller of example 1, wherein the adaptive current limit generator is configured to vary the upper threshold of the current limit range of the current limit signal between the first value and the second value to regulate the switching frequency of the drive signal to the frequency threshold.

Example 3. The controller of example 1 or 2, wherein the power converter is configured to operate in a first mode when the adaptive current limit generator varies the upper threshold of the current limit range of the current limit signal to the first value, wherein the power converter is configured to operate in a second mode when the adaptive current limit generator varies the upper threshold of the current limit range of the current limit signal to the second value, and wherein a power delivery of the power converter is greater when the power converter is configured to operate in the second mode compared to when the power converter is configured to operate in the first mode.

Example 4. The controller of any one of examples 1 to 3, wherein the current limit signal is a ramp signal configured to increase and then subsequently decrease in response to the power switch turning off.

Example 5. The controller of any one of examples 1 to 4, wherein the adaptive current limit generator comprises an upper threshold generator configured to generate the upper threshold of the current limit range in response to the request signal and a frequency threshold voltage representative of the frequency threshold; and a ramp generator coupled to the upper threshold generator configured to generate the current limit signal in response to the drive signal and the upper threshold of the current limit range.

Example 6. The controller of any one of examples 1 to 6, wherein the adaptive current limit generator further comprises a monostable multivibrator coupled to generate a charge signal in response to the drive signal, wherein the ramp generator is configured to generate the current limit signal in response to the charge signal and the upper threshold of the current limit range.

Example 7. The controller of any one of examples 1 to 6, wherein the upper threshold generator comprises a frequency measurement circuit configured to receive the request signal to generate a switching frequency voltage representative of the switching frequency of the power switch; an amplifier stage configured to generate an output in response to a difference between the switching frequency voltage and the frequency threshold voltage; and an integrator configured to generate the upper threshold of the current limit range in response to the output of the amplifier stage and the request signal.

Example 8. The controller of any one of examples 1 to 7 further comprising a limiter coupled to the integrator to limit the upper threshold of the current limit range to a range between the first value and the second value.

Example 9. The controller of any one of examples 1 to 8, wherein the amplifier stage comprises a first transconductance amplifier coupled to receive the switching frequency voltage and the frequency threshold voltage, wherein the output of the amplifier stage is responsive to an output of the first transconductance amplifier.

Example 10. The controller of any one of examples 1 to 9, wherein the amplifier stage further comprises a second transconductance amplifier coupled to receive the switching frequency voltage and the frequency threshold voltage, wherein the output of the amplifier stage is responsive to the output of the first transconductance amplifier and an output of the second transconductance amplifier.

Example 11. The controller of any one of examples 1 to 10, wherein the amplifier stage further comprises a first comparator having a first input coupled to receive the switching frequency voltage and a second input coupled to receive a lower frequency voltage representative of a frequency less than the frequency threshold; a second comparator having a first input coupled to receive a higher frequency voltage representative of a frequency greater than the frequency threshold and a second input coupled to receive the switching frequency voltage; an OR gate coupled to an output of the first comparator and an output of the second comparator, a first switch coupled between the output of the first transconductance amplifier and the output of the second transconductance amplifier, wherein the first switch is configured to be controlled in response to an output of the OR gate; and a second switch coupled between the output of the second transconductance amplifier and a return, wherein the second switch is configured to be controlled in response to an inverted output of the OR gate.

Example 12. The controller of any one of examples 1 to 11, wherein the frequency threshold voltage is representative of 80 kilohertz, and wherein the lower frequency voltage threshold is representative of 65 kilohertz, wherein the higher frequency voltage is representative of 100 kilohertz.

Example 13. The controller of any one of examples 1 to 12, wherein the drive circuit comprises a comparator having a first input coupled to receive the current sense signal and a second input coupled to receive the current limit signal; and a latch having a reset input coupled to an output of the comparator and a set input coupled to receive the request signal, wherein an output of the latch is coupled to generate the drive signal.

Example 14. The controller of any one of examples 1 to 13, wherein the request signal includes a request event representative of the power demand of the output of the power converter, and wherein the drive circuit is configured to output the drive signal to turn ON the power switch in response to the request event.

Example 15. A controller for a power converter, comprising a drive circuit configured to generate a drive signal to control switching of a power switch to a control a transfer of energy from an input-side of the power converter to an output-side of the power converter in response to a request signal including request events representative of an output of the power converter, wherein the drive circuit is configured to turn on the power switch in response to the request events in the request signal; and an adaptive current limit generator configured to generate a current limit signal in response to the drive signal and the request signal, wherein the drive circuit is configured to turn off the power switch when a current sense signal representative of a current through the power switch reaches the current limit signal, wherein the adaptive current limit generator further comprises an upper threshold generator configured to generate an upper threshold of a current limit range of the current limit signal in response to a comparison between a switching frequency of the power switch and a frequency threshold.

Example 16. The controller of example 15, wherein the upper threshold generator comprises an amplifier stage configured to compare a switching frequency of the power switch and a frequency threshold to generate an output, wherein the output of the amplifier stage is configured to vary in response to a difference between the switching frequency of the power switch and the frequency threshold; and an integrator configured to generate the upper threshold of the current limit range of the current limit signal in response to the output of the amplifier stage and the request signal.

Example 17. The controller of example 15 or 16, wherein the adaptive current limit generator further comprises a ramp generator coupled to the upper threshold generator, wherein the ramp generator is configured to generate the current limit signal that increases and then decreases within the current limit range in response to the power switch turning OFF.

Example 18. The controller of any one of examples 15 to 17, wherein the upper threshold generator further comprises a frequency measurement circuit configured to receive the request signal to generate a switching frequency voltage representative of the switching frequency of the power switch, wherein the amplifier stage is configured to generate the output in response to a difference between the switching frequency voltage and a frequency threshold voltage representative of the frequency threshold.

Example 19. The controller of any one of examples 15 to 18, wherein the upper threshold generator is configured to vary the upper threshold of the current limit range between a first value and a second value to regulate the switching frequency to the frequency threshold.

Example 20. The controller of any one of examples 15 to 19, wherein the upper threshold generator further comprises a limiter coupled to the integrator to limit the upper threshold of the current limit range to a range between the first value and the second value.

Example 21. The controller of any one of examples 15 to 20, wherein the limiter is configured to limit the upper threshold to the first value when the switching frequency of the drive signal is less than the frequency threshold, wherein the limiter is configured to limit the upper threshold to the second value when the switching frequency of the drive signal is greater than the frequency threshold, wherein the second value is greater than the first value.

Example 22. The controller of any one of examples 15 to 21, wherein a power consumption of the power converter when the upper threshold of the current limit range is limited to the first value is less than a power consumption of the power converter when the upper threshold of the current limit range is limited to the second value.

Example 23. The controller of any one of examples 15 to 22, wherein the amplifier stage comprises a first transconductance amplifier coupled to receive a switching frequency voltage representative of the switching frequency of the power switch and a frequency threshold voltage representative of the frequency threshold, wherein the output of the amplifier stage is responsive to an output of the first transconductance amplifier.

Example 24. The controller of any one of examples 15 to 23, wherein the amplifier stage further comprises a second transconductance amplifier coupled to receive the switching frequency voltage and the frequency threshold voltage, wherein the output of the amplifier stage is responsive to the output of the first transconductance amplifier and an output of the second transconductance amplifier.

Example 25. The controller of any one of examples 15 to 24, wherein the amplifier stage further comprises a first comparator having a first input coupled to receive the switching frequency voltage and a second input coupled to receive a lower frequency voltage representative of a frequency less than the frequency threshold; a second comparator having a first input coupled to receive a higher frequency voltage representative of a frequency greater than the frequency threshold and a second input coupled to receive the switching frequency voltage; an OR gate coupled to an output of the first comparator and an output of the second comparator; a first switch coupled between the output of the first transconductance amplifier and the output of the second transconductance amplifier, wherein the first switch is configured to be controlled in response to an output of the OR gate; and a second switch coupled between the output of the second transconductance amplifier and a return, wherein the second switch is configured to be controlled in response to an inverted output of the OR gate.

Example 26. The controller of any one of examples 15 to 25, wherein the drive circuit comprises a comparator having a first input coupled to receive the current sense signal and a second input coupled to receive the current limit signal; and a latch having a reset input coupled to an output of the comparator and a set input coupled to receive the request signal, wherein an output of the latch is coupled to generate the drive signal.

What is claimed is:

1. A controller for a power converter, comprising:
   a drive circuit coupled to receive a request signal representative of a power demand of an output of the power converter, wherein the drive circuit is configured to generate a drive signal to control switching of a power switch to a control a transfer of energy from an input-side of the power converter to an output-side of the power converter, wherein the drive circuit is configured to control the power switch in response to the request signal; and
   an adaptive current limit generator configured to generate a current limit signal in response to the drive signal and the request signal, wherein the drive circuit is configured to turn off the power switch when a current sense signal representative of a current through the power switch reaches the current limit signal, the adaptive current limit generator comprising an upper threshold generator configured to receive a frequency threshold voltage ($V_{FTH}$) representative of a frequency threshold and to generate an upper threshold (UPPER) wherein the adaptive current limit generator is configured to:
      in a first mode, set the upper threshold of a current limit range of the current limit signal to a first value (VAL1) when a switching frequency ($f_{SW}$) of the power switch is less than the frequency threshold ($f_{TH}$),
      in a second mode, set the upper threshold of the current limit range of the current limit signal to a second value (VAL2) when the switching frequency of the power switch is greater than the frequency threshold, wherein the second value is greater than the first value, and
      between the first mode and the second mode, transition the upper threshold of the current limit range of the current limit signal within a range between the first value and the second value when the switching frequency of the power switch corresponds to the frequency threshold.

2. The controller of claim 1, wherein the adaptive current limit generator is configured to vary the upper threshold of the current limit range of the current limit signal between the first value and the second value to regulate the power converter.

3. The controller of claim 1, wherein the power converter is configured to operate in the first mode when the adaptive current limit generator sets the upper threshold of the current limit range of the current limit signal to the first value, wherein the power converter is configured to operate in the second mode when the adaptive current limit generator sets the upper threshold of the current limit range of the current limit signal to the second value, and wherein a power delivery of the power converter is greater when the power converter is configured to operate in the second mode compared to when the power converter is configured to operate in the first mode.

4. The controller of claim 1, wherein the current limit signal is a ramp signal configured to increase and then subsequently decrease in response to the power switch turning off.

5. The controller of claim 4, wherein the
   upper threshold generator is configured to generate the upper threshold of the current limit range in response to the request signal; and
   wherein the adaptive current limit generator comprises a ramp generator coupled to the upper threshold generator configured to generate the current limit signal in response to the drive signal and the upper threshold of the current limit range.

6. The controller of claim 5, wherein the adaptive current limit generator further comprises a monostable multivibrator coupled to generate a charge signal in response to the drive signal, wherein the ramp generator is configured to generate the current limit signal in response to the charge signal and the upper threshold of the current limit range.

7. The controller of claim 5, wherein the upper threshold generator comprises:
   a frequency measurement circuit configured to receive the request signal to generate the switching frequency voltage representative of the switching frequency of the power switch;
   an amplifier stage configured to generate an output in response to a difference between the switching frequency voltage and the frequency threshold voltage; and
   an integrator configured to generate the upper threshold of the current limit range in response to an output of the amplifier stage and the request signal.

8. The controller of claim 7, further comprising a limiter coupled to the integrator to limit the upper threshold of the current limit range to a range between the first value and the second value.

9. The controller of claim 7, wherein the amplifier stage comprises a first transconductance amplifier coupled to receive the switching frequency voltage and the frequency threshold voltage, wherein the output of the amplifier stage is responsive to an output of the first transconductance amplifier.

10. The controller of claim 9, wherein the amplifier stage further comprises a second transconductance amplifier coupled to receive the switching frequency voltage and the frequency threshold voltage, wherein the output of the amplifier stage is responsive to the output of the first transconductance amplifier and an output of the second transconductance amplifier.

11. The controller of claim 10, wherein the amplifier stage further comprises:
   a first comparator having a first input coupled to receive the switching frequency voltage and a second input coupled to receive a lower frequency voltage representative of a frequency less than the frequency threshold;
   a second comparator having a first input coupled to receive a higher frequency voltage representative of a frequency greater than the frequency threshold and a second input coupled to receive the switching frequency voltage;

an OR gate coupled to an output of the first comparator and an output of the second comparator;

a first switch coupled between the output of the first transconductance amplifier and the output of the second transconductance amplifier, wherein the first switch is configured to be controlled in response to an output of the OR gate; and a second switch coupled between the output of the second transconductance amplifier and a return, wherein the second switch is configured to be controlled in response to an inverted output of the OR gate.

12. The controller of claim 11, wherein the frequency threshold voltage is representative of 80 kilohertz, and wherein the lower frequency voltage threshold is representative of 65 kilohertz, wherein the higher frequency voltage is representative of 100 kilohertz.

13. The controller of claim 1, wherein the drive circuit comprises:

a comparator having a first input coupled to receive the current sense signal and a second input coupled to receive the current limit signal; and a latch having a reset input coupled to an output of the comparator and a set input coupled to receive the request signal, wherein an output of the latch is coupled to generate the drive signal.

14. The controller of claim 1, wherein the request signal includes a request event representative of the power demand of the output of the power converter, and wherein the drive circuit is configured to output the drive signal to turn ON the power switch in response to the request event.

15. A controller for a power converter, comprising:

a drive circuit configured to generate a drive signal to control switching of a power switch to a control a transfer of energy from an input-side of the power converter to an output-side of the power converter in response to a request signal including request events representative of an output of the power converter, wherein the drive circuit is configured to turn on the power switch in response to the request events in the request signal; and an adaptive current limit generator configured to generate a current limit signal in response to the drive signal and the request signal, wherein the drive circuit is configured to turn off the power switch when a current sense signal representative of a current through the power switch reaches the current limit signal, wherein the adaptive current limit generator further comprises:

an upper threshold generator configured to generate an upper threshold of a current limit range of the current limit signal in response to a comparison between a switching frequency of the power switch and a frequency threshold, a ramp generator coupled to the upper threshold generator, wherein the ramp generator is configured to generate the current limit signal that increases and then decreases within the current limit range in response to the power switch turning OFF.

16. The controller of claim 15, wherein the upper threshold generator comprises:

an amplifier stage configured to compare a switching frequency of the power switch and the frequency threshold to generate an output, wherein the output of the amplifier stage is configured to vary in response to a difference between the switching frequency of the power switch and the frequency threshold; and an integrator configured to generate the upper threshold of the current limit range of the current limit signal in response to the output of the amplifier stage and the request signal.

17. The controller of claim 16, wherein the upper threshold generator further comprises a frequency measurement circuit configured to receive the request signal to generate a switching frequency voltage representative of the switching frequency of the power switch, wherein the amplifier stage is configured to generate the output in response to a difference between the switching frequency voltage and a frequency threshold voltage representative of the frequency threshold.

18. The controller of claim 16, wherein the upper threshold generator is configured to vary the upper threshold of the current limit range between a first value and a second value to regulate the switching frequency to the frequency threshold.

19. The controller of claim 18, wherein the upper threshold generator further comprises a limiter coupled to the integrator to limit the upper threshold of the current limit range to a range between the first value and the second value.

20. The controller of claim 19, wherein the limiter is configured to limit the upper threshold to the first value when the switching frequency of the drive signal is less than the frequency threshold, wherein the limiter is configured to limit the upper threshold to the second value when the switching frequency of the drive signal is greater than the frequency threshold, wherein the second value is greater than the first value.

21. The controller of claim 19, wherein a power consumption of the power converter when the upper threshold of the current limit range is limited to the first value is less than a power consumption of the power converter when the upper threshold of the current limit range is limited to the second value.

22. The controller of claim 16, wherein the amplifier stage comprises a first transconductance amplifier coupled to receive a switching frequency voltage representative of the switching frequency of the power switch and a frequency threshold voltage representative of the frequency threshold, wherein the output of the amplifier stage is responsive to an output of the first transconductance amplifier.

23. The controller of claim 22, wherein the amplifier stage further comprises a second transconductance amplifier coupled to receive the switching frequency voltage and the frequency threshold voltage, wherein the output of the amplifier stage is responsive to the output of the first transconductance amplifier and an output of the second transconductance amplifier.

24. The controller of claim 23, wherein the amplifier stage further comprises:

a first comparator having a first input coupled to receive the switching frequency voltage and a second input coupled to receive a lower frequency voltage representative of a frequency less than the frequency threshold;

a second comparator having a first input coupled to receive a higher frequency voltage representative of a frequency greater than the frequency threshold and a second input coupled to receive the switching frequency voltage;

an OR gate coupled to an output of the first comparator and an output of the second comparator;

a first switch coupled between the output of the first transconductance amplifier and the output of the second transconductance amplifier, wherein the first switch is configured to be controlled in response to an output of the OR gate; and a second switch coupled between the output of the second transconductance amplifier and a return, wherein the second switch is configured to be controlled in response to an inverted output of the OR gate.

25. The controller of claim 15, wherein the drive circuit comprises:

a comparator having a first input coupled to receive the current sense signal and a second input coupled to receive the current limit signal; and a latch having a reset input coupled to an output of the comparator and a set input coupled to receive the request signal, wherein an output of the latch is coupled to generate the drive signal.

26. A controller for a power converter, comprising:

a drive circuit configured to generate a drive signal to control switching of a power switch to a control a transfer of energy from an input-side of the power converter to an output-side of the power converter in response to a request signal including request events representative of an output of the power converter, wherein the drive circuit is configured to turn on the power switch in response to the request events in the request signal; and an adaptive current limit generator configured to generate a current limit signal in response to the drive signal and the request signal, wherein the drive circuit is configured to turn off the power switch when a current sense signal representative of a current through the power switch reaches the current limit signal, wherein the adaptive current limit generator further comprises:

an upper threshold generator configured to generate an upper threshold of a current limit range of the current limit signal in response to a comparison between a switching frequency of the power switch and a frequency threshold, wherein the upper threshold generator comprises:

an amplifier stage configured to compare a switching frequency of the power switch and a frequency threshold to generate an output, wherein the output of the amplifier stage is configured to vary in response to a difference between the switching frequency of the power switch and the frequency threshold; and an integrator configured to generate the upper threshold of the current limit range of the current limit signal in response to the output of the amplifier stage and the request signal.

27. The controller of claim 26, wherein the upper threshold generator further comprises a frequency measurement circuit configured to receive the request signal to generate a switching frequency voltage representative of the switching frequency of the power switch, wherein the amplifier stage is configured to generate the output in response to a difference between the switching frequency voltage and a frequency threshold voltage representative of the frequency threshold.

28. The controller of claim 26, wherein the upper threshold generator is configured to vary the upper threshold of the current limit range between a first value and a second value to regulate the switching frequency to the frequency threshold.

29. The controller of claim 28, wherein the upper threshold generator further comprises a limiter coupled to the integrator to limit the upper threshold of the current limit range to a range between the first value and the second value, wherein the limiter is configured to limit the upper threshold to the first value when the switching frequency of the drive signal is less than the frequency threshold, and wherein the limiter is configured to limit the upper threshold to the second value when the switching frequency of the drive signal is greater than the frequency threshold, wherein the second value is greater than the first value.

* * * * *